US006335236B1

(12) United States Patent
Mori

(10) Patent No.: US 6,335,236 B1
(45) Date of Patent: Jan. 1, 2002

(54) MANUFACTURING METHOD OF SEMICONDUCTOR DEVICE

(75) Inventor: Kiyoshi Mori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/478,533

(22) Filed: Jan. 6, 2000

(30) Foreign Application Priority Data

Jul. 1, 1999 (JP) .......................................... 11-188106

(51) Int. Cl.[7] ......................................... H01L 21/8242
(52) U.S. Cl. ........................ 438/221; 438/241; 438/682
(58) Field of Search ................................. 438/221, 241, 438/258, 296, 660, 682, FOR 193

(56) References Cited

U.S. PATENT DOCUMENTS

| 4,931,411 | A | * | 6/1990 | Tigelaar et al. |
| 5,863,820 | A | * | 1/1999 | Huang |
| 5,998,252 | A | * | 12/1999 | Huang et al. |
| 6,004,843 | A | * | 12/1999 | Huang |
| 6,037,625 | A | * | 3/2000 | Matasubara et al. |
| 6,069,037 | A | * | 5/2000 | Liao |
| 6,136,677 | A | * | 10/2000 | Prein |
| 6,153,459 | A | * | 11/2000 | Sun |
| 6,156,602 | A | * | 12/2000 | Shao et al. |
| 6,221,767 | B1 | * | 4/2001 | Hsu et al. |

FOREIGN PATENT DOCUMENTS

TW        4903403        10/2000

* cited by examiner

Primary Examiner—George Fourson
Assistant Examiner—Joannie Adelle Garcia
(74) Attorney, Agent, or Firm—McDermott, Will & Emery

(57) ABSTRACT

A manufacturing method of a semiconductor device obtaining performances respectively required in a MOS transistor in semiconductor memories and a MOS transistor in logic devices even in case of manufacturing a system LSI combining the semiconductor memories with the logic devices. Forming silicide films 7 in a logic device region 11 makes it possible to reduce the resistivity of diffusion regions 9 and a conductive film 4 of polysilicon or the like that will serve as an electrode of a resulting MOS transistor. Therefore, the semiconductor devices can be manufactured in which such the MOS transistor can be used as the MOS transistor in the logic devices that is required to operate at high speed and the MOS transistor is also formed in a DRAM or the like where miniaturization is required. Since no alternation is made of the structures of the respective MOS transistors, a semiconductor device whose performance is equivalent to that of the conventional counterpart can be manufactured.

8 Claims, 3 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device and, more specifically, to a manufacturing method of a MOS transistor of semiconductor integrated circuits used in storage devices, information processing apparatuses, etc.

2. Description of Related Art

Conventionally, process techniques exist for formation of respective kinds of semiconductor devices such as semiconductor memories and logic devices. For example, there exists a process technique that is specific to formation of a MOS (metal oxide silicon) transistor.

FIG. 3 is a sectional view showing one step of a conventional manufacturing method of a MOS transistor used in a dynamic random access memory (DRAM) that is an example of semiconductor memories. In FIG. 3, reference numeral 1 denotes a silicon substrate; 2, an isolation region formed in the silicon substrate 1 by using an insulating film; 3, a reliable thin insulating film; 4, a conductive film formed on the insulating film 3; 5, an insulating film formed on the conductive film 4; 6, insulating films (sidewalls) for protecting the conductive film 4; and 9, diffusion layers formed by ion implantation. A final MOS transistor is formed by sequentially performing etching etc. after the step of FIG. 3.

FIG. 4 is a sectional view showing one step of a conventional manufacturing method of a MOS transistor used in logic devices. The parts in FIG. 4 that are given the same reference numerals as the corresponding parts in FIG. 3 have the same functions as the latter and hence will not be described. As shown in FIG. 4, in the MOS transistor used in logic devices, silicide films 7 are formed on the conductive film 4 and the diffusion layers 9 to reduce the resistivity of the conductive film 4 and the diffusion layers 9, in other words, to increase the operation speed of the MOS transistor. As described above, the MOS transistor in a DRAM and that in logic devices require processes specific to the respective MOS transistors.

In recent years, with the diversification of the information processing, system LSIs have been developed that are combinations of semiconductor memories and logic devices. For example, a system LSI that is a combination of logic devices and DRAMs as an example of a semiconductor memory is called an embedded-DRAM (hereafter referred to as "eDRAM"). The eDRAM has a feature that it can process a large amount of image data etc. at high speed.

However, as described above, in manufacturing a system LSI such as an eDRAM by combining the DRAMs and the logic devices, formation of MOS transistors in the DRAM and formation of MOS transistors in the logic devices require processes that are specific to the respective kinds of MOS transistors because of differences in their performance. There is a problem that it is difficult to manufacture a system LSI by using processes that are similar to the conventional ones.

SUMMARY OF THE INVENTION

The present invention has been made to solve the above problems in the art, and an object of the invention is therefore to provide a semiconductor device manufacturing method which can provide performance that is required for each of a MOS transistor in a semiconductor memory and that in logic devices even in manufacturing a system LSI that is a combination of semiconductor memories and logic devices.

According to a first aspect of the present invention, there is provided a manufacturing method of a semiconductor device, comprising the steps of: forming an isolation region in a semiconductor substrate by using an insulating film, thereby isolating from each other a first region and a second region that is different from the first region; forming a thin insulating film on the first region and the second region; forming a conductive film on the thin insulating film; forming an insulating film on the conductive film; performing working in the first region and the second region; forming diffusion layers on the first region and the second region by implanting impurity ions; and forming silicide films in pre-determined portions on the second region, whereby the first region and the second region are formed on the semiconductor substrate.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1A:
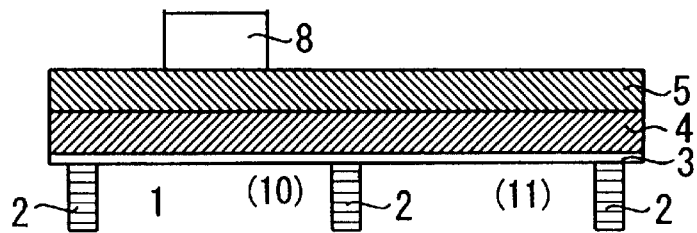
FIGS. 1A–1F are schematic sectional views showing steps of a semiconductor device manufacturing method according to a embodiment 1 of the invention.

Embodiments of the present invention will be described below with reference to the accompanying drawings. It is noted that the same reference symbols in drawings denote the same or corresponding components.

Embodiment 1

FIGS. 1A–1F are schematic sectional views showing steps of a semiconductor device manufacturing method according to a embodiment 1 of the invention. In FIGS. 1A–1F, reference numeral 1 denotes a silicon substrate (semiconductor substrate); 2, isolation regions formed in the silicon substrate 1 by using an insulating film; 3, a reliable thin insulating film; 4, a conductive film formed on the thin insulating film 3; 5, an insulating film formed on the conductive film 4; 6, insulating films as sidewalls for protecting worked conductive films 4; 9, diffusion layers formed by ion implantation; 10, a semiconductor memory region (first region) of a DRAM or the like; and 11, a region (second region) of a logic device or the like.

As shown in FIG. 1A, isolation regions 2 for device isolation having a depth of about 4,000 Å are formed in a silicon substrate 1 by using an insulating film. Then, a thin insulating film 3 of a silicon oxide film or the like is formed by using a diffusion furnace or the like so as to cover the silicon substrate 1 and the isolation regions 2. Then, a conductive film 4 of polysilicon or the like is deposited on the thin insulating film 3 at a thickness of about 2,000 Å, for example, by using a low-pressure CVD furnace or the like, and an insulating film 5 of a silicon oxide film or the like is formed on the conductive film 4 at a thickness of about 1,000 Å, for example. Then, a resist mask 8 is patterned on the insulating film 5 only in the semiconductor memory region 10 by photolithography.

Figure 1B:
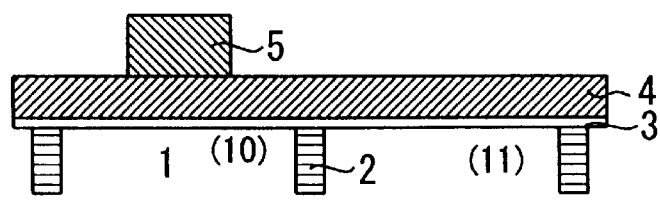

Then, as shown in FIG. 1B, after, the resist mask 8 is patterned, the insulating film 5 of a silicon oxide film or the like is worked by etching. At the same time, the entire insulating film 5 in the logic device region 11 is removed by etching.

Figure 1C:
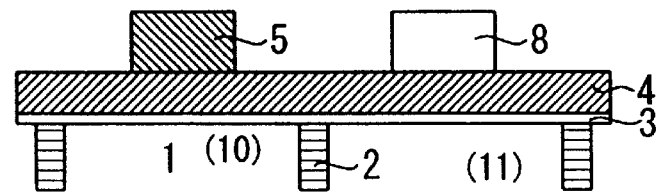

Then, as shown in FIG. 1C, a resist mask 8 is patterned in the logic device region 11 by photolithography.

Figure 1D:
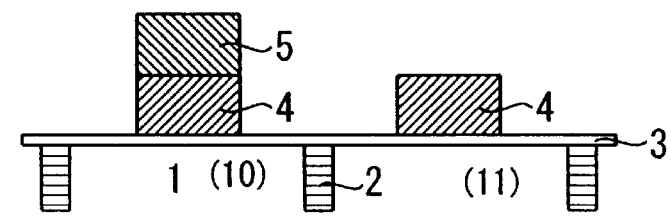

Then, as shown in FIG. 1D, after the resist mask 8 is patterned, the conductive film 4 of polysilicon or the like worked by etching. At the same time, the conductive film 4 in the semiconductor memory region 10 is worked by etching so that the part of the conductive film 4 under the worked insulating film 5 of a silicon oxide film or the like that has been formed in the above step will remain by using the worked insulating film 5 as a hard mask. As a result, a structure can by obtained that includes the semicondutor memory region 10 where the insulating film 5 of a silicon oxide film or the like is formed right above the conductive film 4 of polysilicon or the like that will serve as an electrode of a resulting MOS transistor and the logic device region 11 where no insulating film 5 of a silicon oxide film or the like is formed right above the conductive film 4 of polysilicon or the like.

Figure 1E:
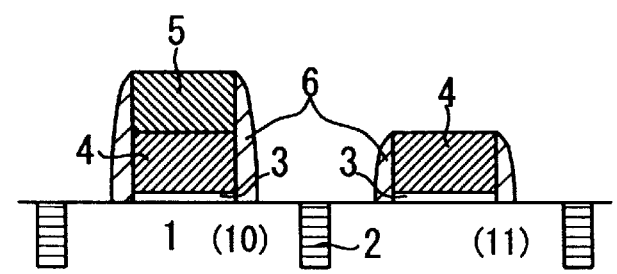

Then, as shown in FIG. 1E, side wall insulating films 6 are deposited at a thickness of about 500 Å to protect the side surfaces of the conductive films 4 of polysilicon or the like that will serve as electrodes of resulting MOS transistors.

Figure 1F:
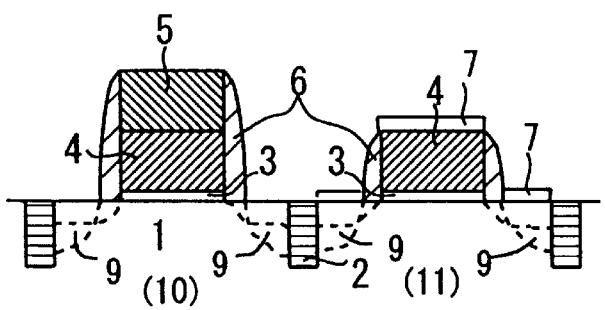

Then, as shown in FIG. 1F, diffusion layers 9 are formed in the semiconductor memory region 10 and the logic device region 11 by implanting impurity ions. Finally, silicide films 7 of cobalt CoSi or the like are formed in the logic device region on the diffusion layers 9 and the conductive film 4 of polysilicon or the like that will serve as an electrode of a resulting MOS transistor by causing, for example, a silicide reaction involving cobalt Co and silicon Si and performing all-etch-back only in the logic device region 11. The silicide to be formed in not limited to cobalt silicon CoSi, and any silicide may be formed as long as it can reduce the resistivity of the diffusion layers 9 and the conductive film 4 of polysiliconor the like that will serve as an electrode of a resulting MOS transistor. For example, titanium silicide TiSi may be formed.

As described above, according to the embodiment 1, forming the silicide films 7 in the logic device region 11 makes it possible to reduce the resistivity of the diffusion regions 9 and the conductive film 4 of polysilicon or the like that will serve as an electrode of a resulting MOS transistor. Therefore, a semiconductor device can be manufactured in which such a MOS transistor can be used as a MOS transistor in a logic device that is required to operate at high speed and a MOS transistor is also formed in a DRAM or the like where miniaturization is required. Since no alternation is made of the structures of the respective MOS transistors, a semiconductor device whose performance is equivalent to that of the conventional counterpart can be manufactured. Further, since an etching operation in the logic device region 11 is performed at the same time as that in the semiconductor memory region 10, the number of manufacturing steps can be reduced.

Embodiment 2

FIGS. 2A–2G are schematic sectional views showing steps of a semiconductor device manufacturing method according to a embodiment 2 of the invention. The parts in FIGS. 2A–2G that are given the same reference numerals as the corresponding parts in FIGS. 1A–1F have the same functions as the latter and hence will not be described. As shown in FIG. 2, the embodiment 2 is different from the embodiment 1 only in steps of FIGS. 2C and 2D; the other steps of the embodiment 2 shown by FIGS. 2A, 2B, and 2E–2G are the same as the step of the embodiment 1 shown by FIGS. 1A, 1B, and 1D–1F, respectively, and hence will not be described.

Figure 2A:
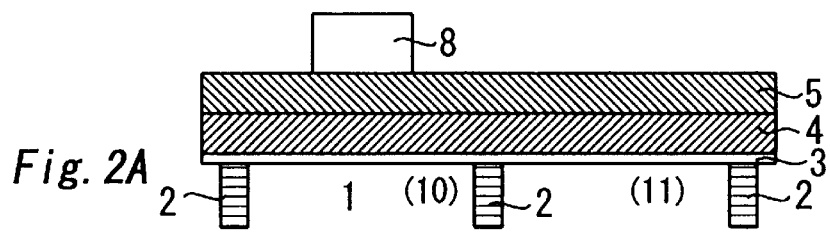
FIGS. 2A–2G are schematic sectional views showing steps of a semiconductor device manufacturing method according to a embodiment 2 of the invention.
Figure 2B:
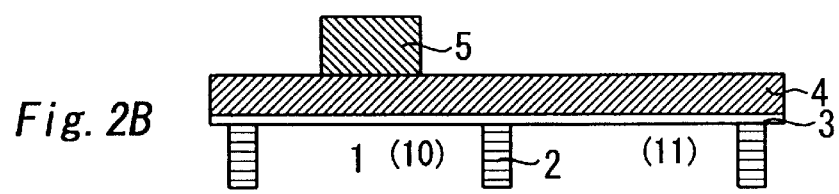
Figure 2C:
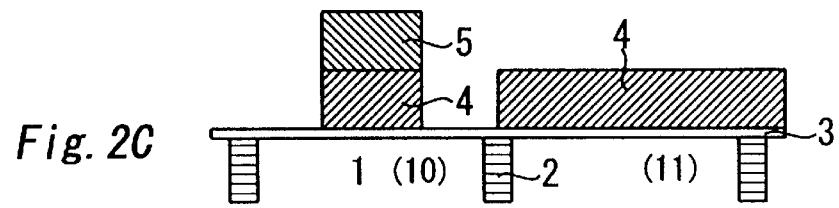

As shown in FIG. 2C, the conductive film 4 of polysilicon of the like in the semiconductor memory region 10 is worked in by etching so that the part of the conductive film 4 under the worked insulating film 5 of a silicon oxide film or the like that has been formed in the preceding step will remain by using the worked insulating film 5 as hard mask. In this step, in the logic device area 11, the entire surface is covered with a resist make (now shown).

Figure 2D:
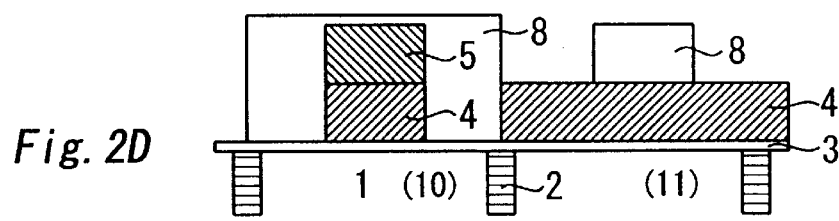
Figure 2E:
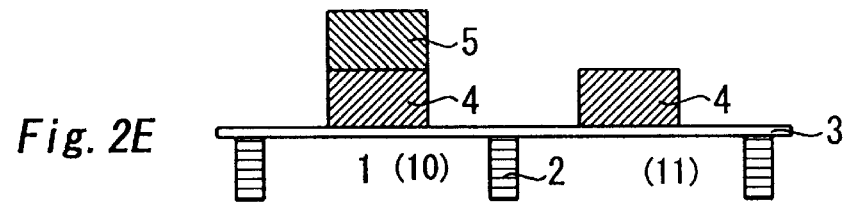
Figure 2F:
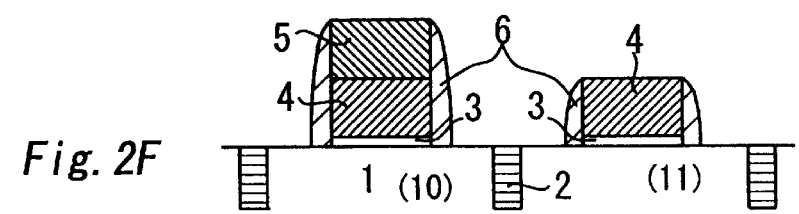
Figure 2G:
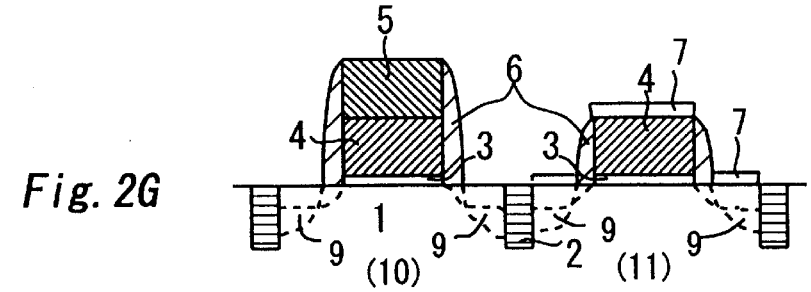
Figure 3:
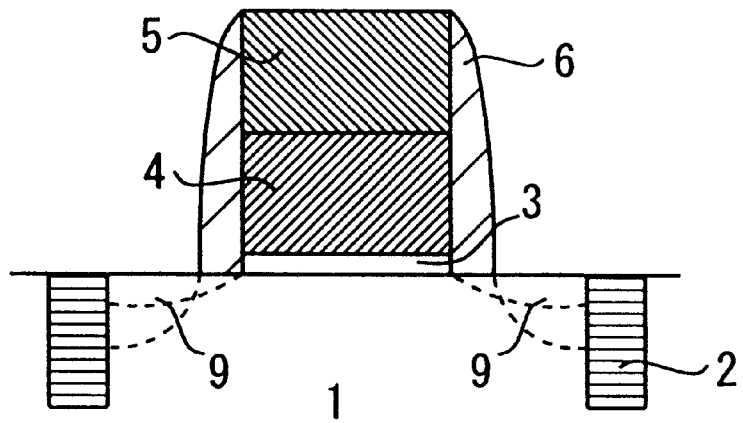
FIG. 3 is a sectional view showing one step of a conventional manufacturing method of a MOS transistor used in a dynamic random access memory (DRAM) that is an example of semiconductor memories.
Figure 4:
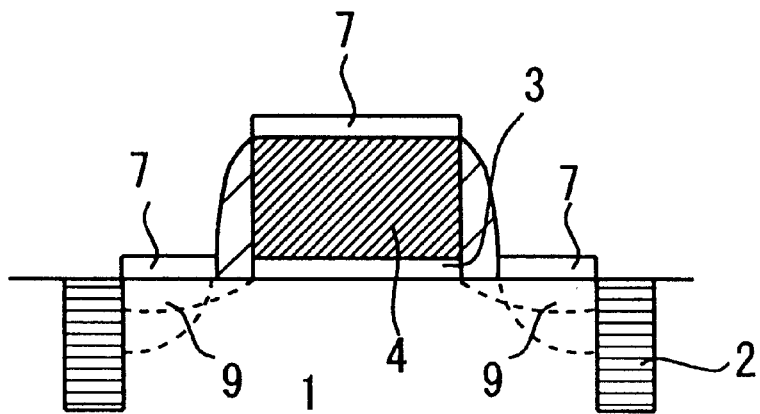
FIG. 4 is a sectional view showing one step of a conventional manufacturing method of a MOS transistor used in logic devices.

Then, as shown in FIG. 2D, a resist mask 8 is patterned in the logic device region 11 while the entire surface of the semiconductor memory region 10 is covered with another resist mask 8. Then, the conductive film 4 of polysilicon or the like worked by etching, whereby the state of FIG. 2E is obtained. As a result, as in the case of the embodiment 1, a structure can be obtained that includes the semiconductor memory region 10 where the insulating film 5 of a silicon oxide film or the like is formed right above the conductive film 4 of polysilicon or the like that will serve as an electrode of a resulting MOS transistor and the logic device region 11 where no insulating film 5 of a silicon oxide film or the like is formed right above right above the conductive film 4 of polysilicon or the like. The ensuing steps of FIGS. 2E–2G are the same as the steps of the embodiment 1 shown by FIGS. 1D–1F as described above, and hence will not be described.

As described above, according to the embodiment 2, forming the silicide films 7 in the logic device region 11 makes it possible to reduce the resistivity of the diffusion regions 9 and the conductive film 4 of polysilicon or the like that will serve as an electrode of a resulting MOS transistor. Therefore, a semiconductor device can be manufactured in which such a MOS transistor can be used as a MOS transistor in a logic device that is required to operate at high speed and a MOS transistor is also formed in a DRAM or the like where miniaturization is required. Since no alternation is made of the structures of the respective MOS transistors, a semiconductor device whose performance is equivalent to that of the conventional counterpart can be manufactured. Further, since etching operations in the logic device region 11 and the semiconductor memory region 10 are performed separately, the etching controllability can be improved.

As described above, the invention can provide a semiconductor device manufacturing method which can provide performance that is required for each of a MOS transistor in semiconductor memory and that in logic devices by forming the silicide films 7 in the logic device region 11, even in manufacturing a system LSI that is a combination of semiconductor memories and logic devices.

In the manufacturing method, the step of performing working may comprise the steps of: working the insulating film by patterning the first region using a resist mask and by etching in the first region, at the same time, removing the entire insulating film by etching in the second region; and working the conductive film by patterning the second region using a resist mask and by etching in the second region, at the same time, working the conductive film by patterning the first region using the insulating film worked by the step of working the insulating film as a hard mask and by etching in the first region.

In the manufacturing method, the step of performing working may comprise the steps of: working the insulating film by patterning the first region using a resist mask and by etching in first region, at the same time, removing the entire insulating film by etching in the second region; and working the conductive film by patterning the first region using the insulating film worked by the step of working the insulating film as a hard mask and by etching in the first region while covering the entire second region with a resist mask; and working the conductive film by patterning the second region using a resist mask and by etching in the second region while covering the entire first region with a resist mask.

In the manufacturing method, the step of forming silicide films may form, in the second region, silicide films for reducing resistivity of the conductive film worked by the step of working the conductive film and the diffusion layers formed by the step of forming diffusion layers on the worked conductive film and the formed diffusion layers.

In the manufacturing method, the step of forming silicide films may form the silicide films by causing a reaction of cobalt and silicon.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-188106 filed on Jul. 1, 1999 including specification, claims, drawings and summary are incorporated herein by reference in its entirety.

What is claimed is:

1. A manufacturing method of a semiconductor device, comprising the steps of:

forming an isolation region in a semiconductor substrate by using an insulating film, thereby isolating from each other a first region and a second region that is different from the first region;

forming a thin insulating film on said first region and said second region;

forming a conductive film on said thin insulating film;

forming a second insulating film on said conductive film;

working said second insulating film by patterning said first region using a first resist mask and by etching in said first region, at the same, removing the entire second insulating film by etching in said second region;

working said conductive film by patterning said second region using a second resist mask and by etching in said second region, at the same time, working said conductive film by patterning said first region using the second insulating film worked by said step of working said second insulating film as a hard mask and by etching in said first region;

forming dissusion layers on said first region and said second region by implanting impurity ions; and forming silicide films in portions on said second region, whereby said first region and said second region are formed on said semiconductor substrate.

2. The manufacturing method according to claim 1, wherein said step of forming silicide films forms, in said second region, silicide films for reducing resistivity of the conductive film worked by said step of working said conductive film and the diffusion layers formed by said step of forming diffusion layers on the worked conductive film and the formed diffusion layers.

3. The manufacturing method according to claim 2, wherein said step of forming silicide film forms the silicide films by causing a reaction of cobalt and silicon.

4. The manufacturing method according to claim 1, wherein said step of forming silicide films forms the silicide films by causing a reaction of cobalt and silicon.

5. A manufacturing method of a semiconductor device, comprising the steps of:

forming an isolation region in a semiconductor substrate by using an insulating film, thereby isolating from each other a first region and a second region that is different from the first region;

forming a thin insulating film on said first region and said second region;

forming a conductive film on said insulating film;

forming a second insulating film on said conductive film;

working said second insulating film by patterning said first region using a first resist mask and by etching in said first region, at the same time, removing the entire second insulating film by etching in said second region;

working said conductive film by patterning said first region using the second insulating film worked by said step of working said second insulating film as a hard mask and by etching in said first region while covering the entire second region with a second resist mask;

working said conductive film by patterning said second region using a third resist mask and by etching in said second region while covering the entire first region with a fourth resist mask;

forming diffusion layers on said first region and said second region by implanting impurity ions; and forming silicide films in portions on said second region, whereby said first region and said second region are formed on said semiconductor substrate.

6. The manufacturing method according to claim 5, wherein said step of forming silicide films forms, in said second region, silicide films for reducing resistivity of the conductive film worked by said step of working said conductive film and the diffusion layers formed by said step of forming diffusion layers on the worked conductive film and the formed diffusion layers.

7. The manufacturing method according to claim 6, wherein said step of forming silicide films forms the silicide films by causing a reaction of cobalt and silicon.

8. The manufacturing method according to claim 5, wherein said step of forming silicide films forms the silicide films by causing a reaction of cobalt and silicon.

* * * * *